(12) United States Patent
Mistry et al.

(10) Patent No.: US 6,815,254 B2
(45) Date of Patent: Nov. 9, 2004

(54) SEMICONDUCTOR PACKAGE WITH MULTIPLE SIDES HAVING PACKAGE CONTACTS

(75) Inventors: Addi B. Mistry, Austin, TX (US);
Joseph M. Haas, Austin, TX (US);
Dennis O. Kiffe, Leander, TX (US);
James H. Kleffner, Leander, TX (US);
Daryl R. Wilde, Cedar Park, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 42 days.

(21) Appl. No.: 10/385,018

(22) Filed: Mar. 10, 2003

(65) Prior Publication Data

US 2004/0178499 A1 Sep. 16, 2004

(51) Int. Cl.[7] .......................... H01L 21/44; H01L 23/48
(52) U.S. Cl. ...................... 438/108; 257/777; 257/685
(58) Field of Search ................................ 257/777, 685, 257/686, 675, 734, 781, 704, 723, 719; 438/108, 109

(56) References Cited

U.S. PATENT DOCUMENTS

| | | | |
|---|---|---|---|
| 5,222,014 A | | 6/1993 | Lin |
| 6,057,598 A | * | 5/2000 | Payne et al. ................ 257/723 |
| 6,133,637 A | * | 10/2000 | Hikita et al. ................ 257/777 |
| 6,225,688 B1 | | 5/2001 | Kim et al. |
| 6,268,654 B1 | * | 7/2001 | Glenn et al. ................ 257/704 |
| 6,329,224 B1 | | 12/2001 | Nguyen et al. |
| 6,376,914 B2 | | 4/2002 | Kovats et al. |
| 6,643,136 B2 | * | 11/2003 | Hsu .......................... 361/719 |
| 6,677,674 B2 | * | 1/2004 | Nagao ........................ 257/724 |

OTHER PUBLICATIONS

Tessera Product Brochure, "VM–288FμZ™ Fold–Over Test Vehicle wih DRAM Interface," 2002, 2 pgs.

* cited by examiner

*Primary Examiner*—Long Pham
*Assistant Examiner*—(Vikki) Hoa B. Trinh
(74) *Attorney, Agent, or Firm*—Robert L. King; David G. Dolezal

(57) ABSTRACT

A semiconductor package assembly 10 has an intervening package (12) that may be connected to a first package (14) from a first substrate (20) on a first side of the package (12) and to a second package (13) from a second substrate (53) on a second, opposing side of the package (12). Electrical contact to a semiconductor die (32) is made from the first side by wire bonding to wire bond posts (26) and by balls (46, 48) from the second side. Electrical contact from one side of the intervening package (12) to the other may be made by bypassing the die. Electrical contact on either side of the intervening package may be made both within and outside the footprint of the semiconductor die (32).

28 Claims, 3 Drawing Sheets

SEMICONDUCTOR PACKAGE WITH MULTIPLE SIDES HAVING PACKAGE CONTACTS

FIELD OF THE INVENTION

This invention relates to packaging of semiconductors, and more particularly to small form factor semiconductor packages.

BACKGROUND OF THE INVENTION

Semiconductor packages generally have allowed access to the internal die only from a bottom side of the package. This limitation creates an increase in the footprint or size of the package. Additionally, a large number of pins, such as input/output (I/O) and power/ground pins have to be replicated in numerous locations. In addition to these issues, many products are migrating to implementing systems with multiple integrated circuit die in a package. In the past, such circuits have been implemented both in a stacked configuration and a non-stacked configuration which clearly is not size efficient. For those packages with stacked integrated circuit die, the amount of scrap product created during an early manufacturing phase of a part the yield is typically low. It is desirable to be able to rework or modify an integrated circuit in a stacked die formation after encapsulation has occurred. This is not possible with most packages.

Because electronic products continue to be miniaturized, various integrated circuits are combined to form systems with only a few integrated circuits. Existing semiconductor packages are limiting with respect to what types of products may be combined and are limiting with respect to the package type that can be inter-coupled. U.S. Pat. No. 6,225,688 entitled "Stacked Microelectronic Assembly And Method Therefor" proposes an assembly having a metal tape that is folded and terminates in a single I/O port. The tape is connected to only one side of each die and each die is accessible only from one side. The length through the tape from the I/O to the farthest die would create speed and noise problems for wireless applications. Also, folding of conductive tape may create conductivity reliability and is sensitive to mechanical stresses.

BRIEF DESCRIPTION OF THE DRAWINGS

The foregoing and further and more specific objects and advantages of the instant invention will become readily apparent to those skilled in the art from the following detailed description of the invention taken in conjunction with the following drawings.

The drawings are not necessarily drawn to scale and portions are disproportionately enlarged for purposes of illustration and explanation.

DETAILED DESCRIPTION OF THE INVENTION

Figure 1:
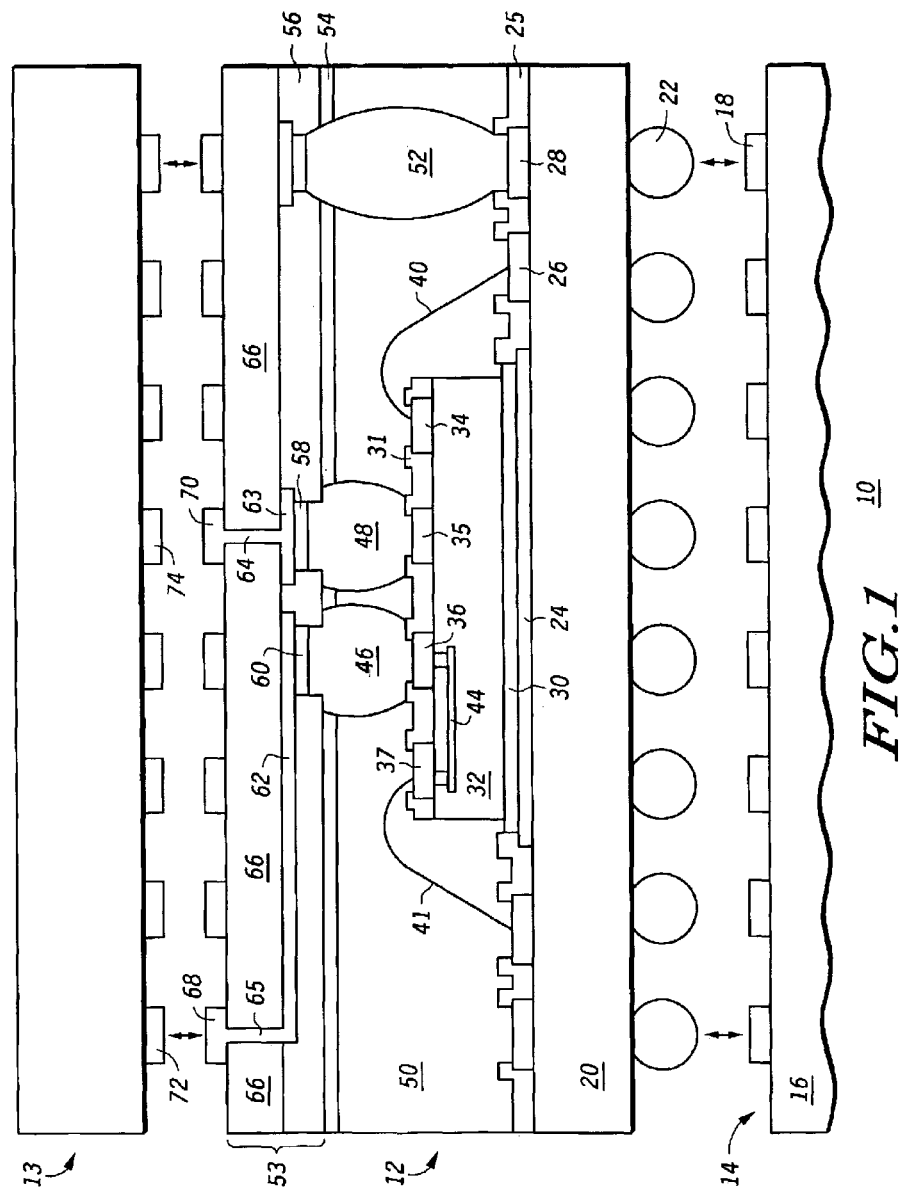
FIG. 1 illustrates in cross-sectional form a semiconductor package in accordance with the present invention.

Illustrated in FIG. 1 is a package assembly 10 having a semiconductor package 12 for electrical connection to a semiconductor package 13 and a semiconductor package 14. In the illustrated form, semiconductor package 13 and 14 may be implemented as an integrated circuit, a printed circuit board or as specific components.

Assuming that semiconductor package 14 is a printed circuit board 16, the semiconductor package 14 has a plurality of circuit board pads at a surface. For example a circuit board pad 18 protrudes from the surface of semiconductor package 14. In alternative forms, the circuit board pads may any contact structure that will function as a landing pad for receiving a solder ball.

The semiconductor package 12 has a primary substrate 20 that may be implemented with either a flexible material or a rigid material. If implemented as a rigid material, either an organic or a ceramic substrate may be used. For example, primary substrate 20 may be implemented with a flexible tape. On an exposed surface of the primary substrate 20 are a number of package contacts such as conductive spheres, such as a sphere 22 for making a package contact. On an opposite surface of the primary substrate 20 is a die landing pad 24. Additionally, a plurality of wire bond posts, such as a wire bond post 26, is positioned on the primary substrate adjacent the die landing pad. It should be noted that the depth of the posts, such as wire bond post and the die landing pad 24 are typically the same. Therefore, it should be apparent that the illustrated features are not necessarily drawn to scale for ease of explanation. A post 28 positioned on the primary substrate 20 supports a contact structure 52. An optional protective layer 25 overlies the primary substrate 20 and protects underlying substrate traces (not shown). The upper surface profile of protective layer 25 is nonplanar because the deposition rate adjacent metallic surfaces such as the pads and the die landing pad is greater than on the primary substrate. Each of the posts on the primary substrate 20 is connected in a predetermined manner (not shown) to one of the underlying spheres such as sphere 22. The electrical contact may be by vias, interconnects, etc. depending upon which wire bond post is connect to which sphere. A die attach material overlies the die landing pad 24. A semiconductor die 32 is placed on the die attach material. On the die are a plurality of die pads such as a die pad 34, a die pad 35, a die pad 36 and a die pad 37 for electrical contact to circuitry (not shown) within the semiconductor die 32. Surrounding the die pads 34–37 is a protective passivation 31 for protecting the underlying circuitry. As with protective layer 25, the upper surface profile of protective layer 25 is nonplanar because the deposition rate adjacent metallic surfaces such as the die pads is greater than on the die.

Bond wires, such as bond wire 40 and bond wire 41, are used to electrically connect predetermined ones of the die pads to wire bond posts. It should also be understood that the bond wires may make connection to semiconductor die 32 at conductive targets on semiconductor die 32 other than bond pads. Examples would include conductive targets of metal studs or connecting a bond wire directly to a conductive bump or to the same die pad that a conductive bump is positioned on. For example, bond wire 40 connects die pad 34 to the wire bond post 26. In the illustrated form, an interconnect conductor, structure 44. Overlying certain die pads are contact structures, such as ball 46 overlying die pad 36 and ball 48 overlying die pad 35. Ball 46 and ball 48 function as a contact structure. Other types of contact structures may be used rather than a ball, such as a metal bump (typically a solder, a lead/tin solder or lead-free solder bump), an organic bump formed of an organic conductive material, metal studs (such as gold or copper studs) or more than one ball, such as two (or more) stacked balls. Surrounding a large portion of semiconductor package 12 is a nonconductive encapsulant 50. A contact structure 52 extends through the encapsulant 50. Contact structure 52 may be implemented with a dual ball or a single ball or with other contact structures.

An adhesive layer 54 is placed over encapsulant 50 and around ball 46, ball 48 and contact structure 52. A secondary substrate 53 is formed over adhesive layer 54. Typically, secondary substrate 53 is formed separate from the package structure described to this point and is then combined with the existing structure. In the illustrated form, secondary substrate 53 has two metal layers, formed by metal trace 62, conductive pad 63 and pads 68, 70, respectively. However, it should be well understood that a secondary substrate may be implemented using a single or other multiple layers. Additionally, in some applications, the secondary substrate 53 is not required and direct electrical contact is established between balls 46, 48 and semiconductor package 13.

Secondary substrate 53 has a solder mask 56 which overlies adhesive layer 54 and surrounds ball 46, ball 48, contact structure 52, a metalized pad plating 58 and a metalized pad plating 60. Metalized pad plating 58 overlies and is in electrical contact with ball 48. Similarly, metalized pad plating 60 overlies and is in electrical contact with ball 46. A metal trace 62 overlies. metalized pad plating 60 and extends laterally through solder mask 56 to a filled via 65 that extends to a package contact such as a pad 68. Metal trace 62 functions as redistribution circuitry to redistribute the position of electrical contact to the semiconductor package 13. Metal trace 62 makes a good electrical contact with ball 46. A conductive pad 63 overlies the metalized pad plating 58 for making electrical contact to ball 48. A filled via 64 contacts a package contact in the form of pad 70. An insulating substrate material such as a polyimide layer 66 overlies solder mask 56 and metal trace 62 and surrounds via 64 and via 65. Multiple pads are formed overlying the polyimide layer 66. Although not expressly illustrated, each pad may be electrically connected to either semiconductor die 32 or to one of solder spheres 22 through semiconductor package 12. It should be understood that semiconductor package 12 may contain multiple die that would be placed lateral to either or both sides of the package illustrated in FIG. 1. Such a configuration would provide the advantage of flexible interface routing within the primary substrate 20 between multiple die.

Semiconductor package 13 is placed overlying semiconductor package 12 and has multiple pads such as a pad 72 and a pad 74. The semiconductor package 13 may be any type of device, including an electronic die, a printed circuit board or a packaged die.

In the illustrated form, semiconductor package 12 may be used in a stacked assembly having multiple components such as a packaged die and a printed circuit board. In package assembly 10, high signal integrity is created and maintained because the distance between each connection with semiconductor die 32 and the pads, such as pads 68 and 70, is minimized.

Assume that an RF sensitive device is incorporated into semiconductor package 13. Instead of using pads such as pads 68, 70 a metal patch may be placed laterally in an XY direction over polyimide layer 66. Any electromagnetic radiation (EMI) that is transmitted or received between package 12 and semiconductor package 13 is blocked. The amount of shielding may be custom placed in strategic areas of the polyimide layer 66 as required by any particular application.

It should be noted that since electrical contact to semiconductor die 32 may be made from two sides of the die, a reduction in the lateral positioning of the I/O pads for the die on a single side is reduced significantly. The electrical connection of a single die with multiple devices, one on the top and one on the bottom, also decreases the total number of I/O pads that are required to be implemented. This is because it is possible to design the connection of a same I/O function for each component rather than having to implement separate I/O connections onto a substrate which in turn reduces the number of layers of the substrate. Thus the cost of manufacturing the substrate is also reduced.

It should also be noted that connection from ball 46 to die pad 37 may be implemented via connection to die pad 36 and interconnect conductor structure 44. In this way, various interconnects within the semiconductor die 32 may be designed to accommodate the package design. This feature is particularly advantageous for die designs that have internally located die pads, whether the pads are wire bonded or bumped.

Contact structure 52 permits electrical connection between each side of semiconductor package 12 without contacting semiconductor die 32. For some package assembly applications, it may be desired to make electrical contact directly between semiconductor package 13 and semiconductor package 14. Since various interconnect routing can be provided within each of primary substrate 20 and secondary substrate 53, contact structure 52 may also connect a contact within the footprint of semiconductor die 32 on each surface of the semiconductor package 12.

Figure 2:
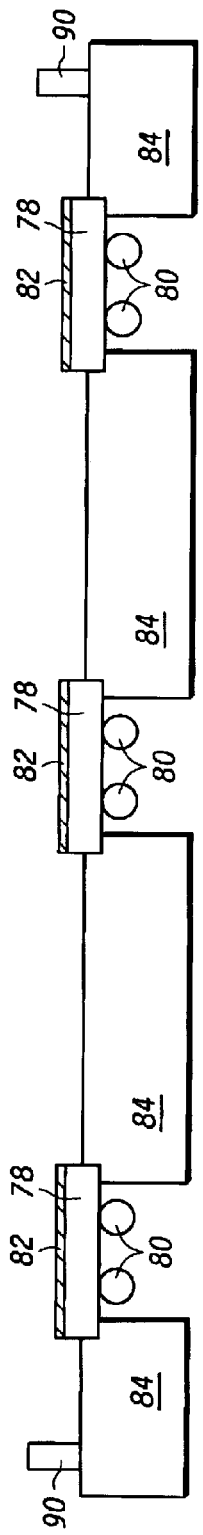
FIGS. 2–7 illustrate in cross-sectional form a method for assembling a semiconductor package in accordance with the present invention.

Illustrated in FIG. 2 is a cross section of an early stage in the formation of a strip of semiconductor devices. Multiple die, such as die 78 each have balls connected thereto, such as balls 80. An adhesive 82 overlies die 78. By way of example only, adhesive 82 is implemented as epoxy. In the illustrated form, balls 80 are equivalently represented as ball 46 and ball 48 in FIG. 1 so that the position of die 78 is inverted from the position of semiconductor die 32 of FIG. 1. Each of the die 78 is positioned in a die fixture 84. Die fixture 84 has multiple locator pins 90 positioned.

Figure 3:
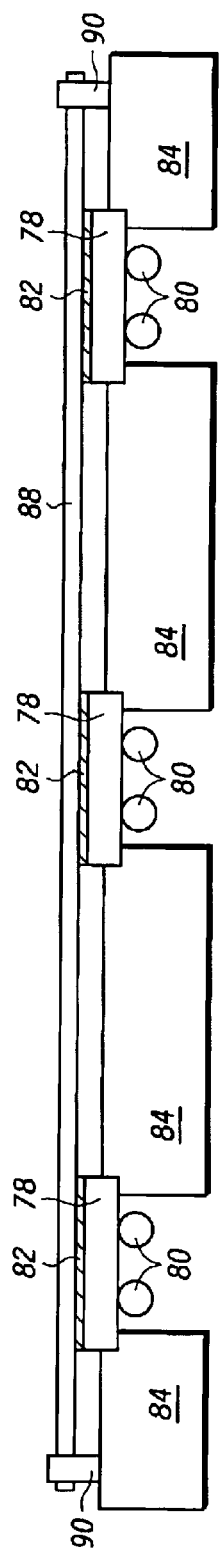

Illustrated in FIG. 3 is a next processing step in the formation of the strip of semiconductor devices. A strip 88 is positioned by the locator pins 90 and secured by the adhesive 82. Strip 88 may be implemented as either a flexible tape or a rigid substrate. After strip 88 is placed on adhesive 82, the adhesive 82 is cured.

Figure 4:
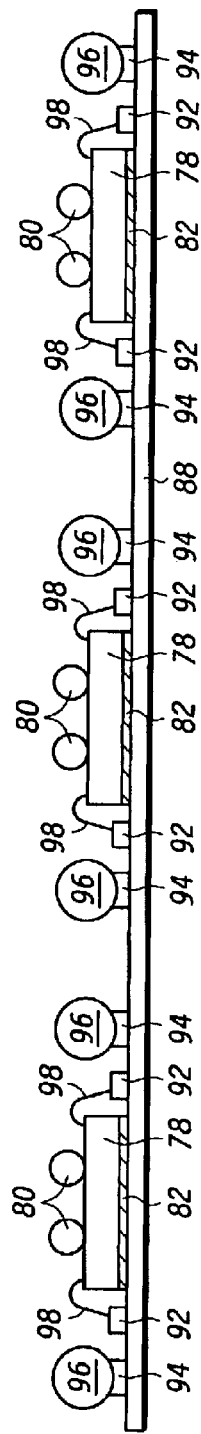

Illustrated in FIG. 4 is a sequential processing step in the formation of the strip of semiconductor devices. Die fixture 84 is removed from between the die 78 and the assembly is inverted. Each of die 78 are bonded and balls are attached as described herein. Bonding posts 92 are wire bonded to a predetermined bond pad of die 78 via a bonding wire 98. Ball pads 94 are located on the strip 88 and atop each ball pad 94 is a ball 96. Each ball 96 is placed on a respective ball pad by a conventional ball process.

Figure 5:
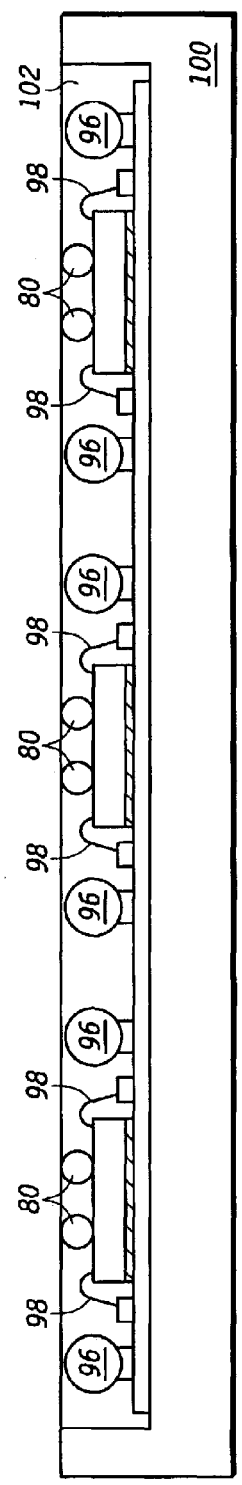
Figure 6:
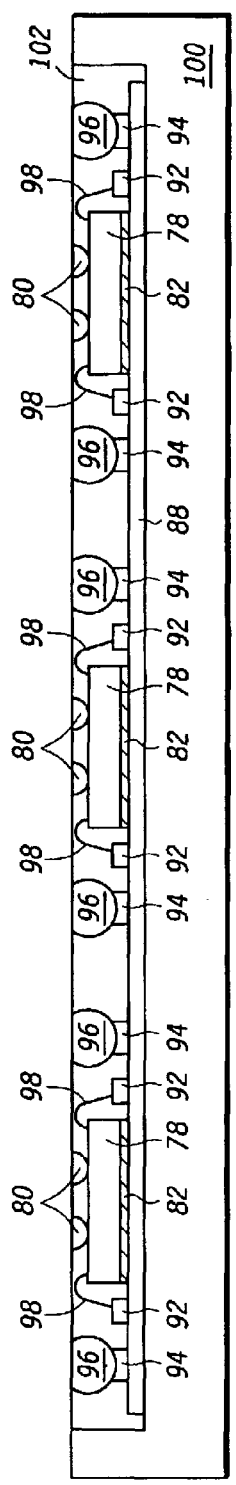

Illustrated in FIG. 5 is a subsequent processing step in the formation of the strip of semiconductor devices. The strip is molded with an encapsulant material 102 that, in one form, is either a nonconductive adhesive or an epoxy. A fixture 100 is provided to hold the entire strip to enable lapping or thinning of the encapsulating structure of the strip. Between the FIG. 5 and FIG. 6 illustrations, a lapping process is implemented to remove a portion of the upper material in the strip without scratching the material. Various known processes are capable of removing the material in a non-abrasive manner.

Illustrated in FIG. 6 is a subsequent processing step in the formation of the strip of semiconductor devices after the lapping is implemented. It should be noted that the balls such as ball 96 and ball 80 are therefore no longer spherical as the top surfaces have been planarized for electrical contact thereto.

Figure 7:
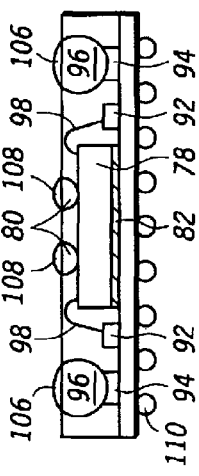

Illustrated in FIG. 7 is a final processing step for the semiconductor package. The encapsulant fixture 100 is initially removed. The strip has conductive spheres, such as sphere 110, attached using a conventional ball attach process. The devices within the strip are singulated. If required, individual packages may have additional solder, such as solder 106 and solder 108, formed above the balls. Such additional solder may be formed, for example, by a conventional stencil processes.

As an alternative process, the die could be picked and placed on a previously prepared epoxy or an adhesive tape on the substrate. The epoxy is cured and the strip is then mounted into an underfill fixturing that has a plurality of predetermined slots arising from a surface of the underfill fixturing. In each of the slots, a nonconductive encapsulant is filled ensuring that the balls are not completely covered by the encapsulant. With this underfill fixturing, the slots function as a dam bar to retain the encapsulant. The encapsulant is cured and a clean of the exposed balls is performed. An adhesive is applied prior to mounting the secondary substrate. The secondary substrate is mounted by using a thermal compression technique. In one form, a compression force of about 70 gm/bump at a temperature of at least 160 degrees Celsius is used. The strip is removed from the underfill fixturing and the components are then singulated.

By now it should be apparent that there has been provided a semiconductor package for use with additional packages or printed circuit boards. The total package area and height are reduced by providing efficient routing. An RF and EMI shield may be implemented without adding additional processing steps. By having two sides of the package that have contacts, great flexibility is provided to attach two different components to the package. Additionally, the size of the package and the number of input/output connections to the package are reduced. The illustrated package provides flexibility for putting any other modules or components on either side of the package. This arrangement permits separation of portions of an attached board or package from the package based upon the type of module for RF isolation or EMI isolation purposes. By splitting the I/Os between the top surface and the bottom surface, the number of I/Os required for the system is minimized. Reducing the number of I/Os permits an increase in the pitch size of conductive balls, which in turns reduces the cost of the motherboard because of the larger ball pitch. It should be noted that electrical contact on either side of the package may be made both within and outside the footprint of the die which is immediately above or below the die.

Various changes and modifications to the embodiments herein chosen for purposes of illustration will readily occur to those skilled in the art. For example, discrete components such as resistors, inductors and capacitors may be connected between the wire bond posts on the surface of primary substrate 20 if desired. To the extent that such modifications and variations do not depart from the spirit of the invention, they are intended to be included within the scope thereof that is assessed only by a fair interpretation of the following claims.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. The terms a or an, as used herein, are defined as one or more than one. The term plurality, as used herein, is defined as two or more than two. The term another, as used herein, is defined as at least a second or more. The terms including and/or having, as used herein, are defined as comprising (i.e., open language). The term coupled, as used herein, is defined as connected, although not necessarily directly, and not necessarily mechanically.

We claim:

1. A semiconductor package comprising:
    a first plurality of package contacts located at a first side of the semiconductor package;
    a second plurality of package contacts located at a second side of the semiconductor package, the first side of the semiconductor package being an opposing side to the second side of the semiconductor package;
    a substrate;
    a semiconductor die, a first side of the semiconductor die faces a first side of the substrate, wherein the semiconductor die includes a first plurality of die pads located at a second side of the semiconductor die, the second side of the semiconductor die being an opposing side to the first side of the semiconductor die, each of the first plurality of die pads is wired bonded to a conductive structure located at the first side of the substrate to electrically couple each die pad to a respective package contact of the first plurality of package contacts, wherein the semiconductor die includes a second plurality of die pads located at the second side of the semiconductor die; and
    a plurality of contact structures, each of the plurality of contact structures located between a die pad of the second plurality of die pads and the second side of the semiconductor package to electrically couple the die pad of the second plurality of die pads to a package contact of the second plurality of package contacts.

2. The semiconductor package of claim 1 further comprising:
    a second substrate, the semiconductor die located between the substrate and the second substrate, the second substrate including a plurality of conductive structures, each contact structure of the plurality of contact structures is located between a predetermined respective die pad of the second plurality of die pads and a predetermined respective conductive structure of the plurality of conductive structures of the second substrate to electrically couple the predetermined respective die pad of the second plurality of die pads to the predetermined respective conductive structure of the plurality of conductive structures of the second substrate.

3. The semiconductor package of claim 2 wherein each contact structure of the plurality of contact structures extends from a die pad of the second plurality of die pads to a conductive structure of the plurality of conductive structures of the second substrate.

4. The semiconductor package of claim 2 wherein the conductive structures of the plurality of conductive structures of the second substrate are located at a first side of the second substrate, wherein the second plurality of package contacts are located at a second side of the second substrate, wherein the first side of the second substrate is an opposing side to the second side of the second substrate.

5. The semiconductor package of claim 4 wherein the second substrate further comprises a plurality of redistribution circuitry, wherein each of the redistribution circuitry electrically couples a conductive structure of at least a group of the plurality of conductive structures of the second substrate with a package contact of at least a group of the second plurality of package contacts.

6. The semiconductor package of claim 1 wherein each contact structure of the plurality of contact structures includes at least a portion of a solder ball.

7. The semiconductor package of claim 1 wherein each contact structure of the plurality of contact structures includes a bump.

8. The semiconductor package of claim 1 wherein each contact structure of the plurality of contact structures includes a stud.

9. The semiconductor package of claim 1 wherein each contact structure of the plurality of contact structures includes at least one of gold, copper, and an organic conductive material.

10. The semiconductor package of claim 1 further comprising:
a plurality of wires, each of the first plurality of die pads are wired bonded with a wire of the plurality of wires to a conductive structure located at the first side of the substrate; and
an encapsulant of encapsulating material, the encapsulant encapsulating the plurality of wires and a portion of each of the plurality of contact structures, wherein a portion of each of the plurality of contact structures is exposed with respect to a first side of the encapsulant.

11. The semiconductor package of claim 10 wherein the first side of the encapsulant is at least generally parallel to the second side of the semiconductor die.

12. The semiconductor package of claim 10 further comprising:
a second substrate, the second substrate including a plurality of conductive structures, each contact structure of the plurality of contact structures is located between a predetermined respective die pad of the second plurality of die pads and a conductive structure of the plurality of conductive structures of the second substrate to electrically couple the predetermined respective die pad of the second plurality to the conductive structure of the plurality of conductive structures of the second substrate, the second substrate is attached to the first side of the encapsulant.

13. The semiconductor package of claim 1 wherein each of the second plurality of package contacts is an exposed portion of a contact structure of the plurality of contact structures.

14. The semiconductor package of claim 1 further comprising:
a plurality of wires, each of the first plurality of die pads is wired bonded with a predetermined respective wire of the plurality of wires to a conductive structure located at the first side of the substrate;
wherein each of the plurality of contact structures includes a portion located above each of the wires of the plurality of wires.

15. A semiconductor package assembly comprising the semiconductor package of claim 1, the semiconductor package assembly further comprising:

a second semiconductor package located over the semiconductor package, the second semiconductor package including a plurality of package contacts located on a first side of the second semiconductor package, the first side of the second semiconductor package facing the second side of the semiconductor package;
wherein each of the second plurality of package contacts of the semiconductor package is electrically coupled to a package contact of the plurality of package contacts of the second semiconductor package.

16. A method for making a semiconductor package, the method comprising:
physically coupling a die to a substrate, a first side of the die facing a first side of the substrate;
wire bonding, with a respective wire of a plurality of wires, each of a first plurality of die pads located at a second side of the die to a conductive structure of a plurality of conductive structures located at the first side of the substrate, the second side of the die being an opposing side to the first side of the die;
forming a plurality of contact structures, each contact structure of the plurality of contact structures located over and electrically coupled to a die pad of a second plurality of die pads located at the second side of the die; and
forming an encapsulant to encapsulate the wires of the plurality of wires and at least a portion of each of the plurality of contact structures, wherein the encapsulant has a first side located above the second side of the die, wherein at least a portion of each of the plurality of contact structures is exposed with respect to the first side of the encapsulant.

17. The method of claim 16 wherein the forming the encapsulant further comprises:
forming an encapsulating structure to encapsulate the wires of the plurality of wires and the plurality of contact structures; and
removing a portion of the encapsulating structure to expose at least a portion of each contact structure of the plurality of contact structures with respect to the first side of the encapsulant.

18. The method of claim 17 wherein the removing further includes lapping the encapsulating structure to remove the portion of the encapsulating structure.

19. The method of claim 17 wherein the forming the plurality of contact structures further comprises:
applying solder to each of the at least a portion of the plurality of contact structures exposed from removing the portion of the encapsulating structure.

20. The method of claim 16 wherein forming the encapsulate further comprises:
applying an encapsulating material over the substrate up to a first level, wherein the first level is located below a top portion of each of the plurality of contact structures.

21. The method of claim 16 further comprising:
coupling a second substrate to the encapsulant, the second substrate having a first side and a second side wherein the first side is an opposing side to the second side, wherein the first side of the encapsulant faces the first side of the second substrate, wherein the coupling further includes electrically coupling each of the plurality of contact structures to an electrically conductive structure of a plurality of electrically conductive structures of the second substrate.

22. The method of claim 16 further comprising:

forming a first plurality of package contacts on a first side of the semiconductor package;

forming a second plurality of package contacts on a second side of the semiconductor package, wherein the first side of the semiconductor package is an opposing side to the second side of the semiconductor package;

wherein the first plurality of die pads are electrically coupled to the first plurality of package contacts, and the second plurality of die pads are electrically coupled to the second plurality of package contacts.

23. The method of claim 22 further comprising:

coupling a second semiconductor package to the semiconductor package, wherein the second side of the semiconductor package faces a first side of the second semiconductor package, wherein the coupling further includes electrically coupling each of the second plurality of package contacts to each of a plurality of package contacts located at a first side of the second semiconductor package.

24. A semiconductor package comprising:

a substrate;

a plurality of wires;

a die physically coupled to the substrate, a first side of the die facing a first side of the substrate, the die including a first plurality of die pads located at a second side of the die, the second side of the die being an opposing side to the first side of the die, each of the first plurality of die pads is wired bonded with a predetermined one of the plurality of wires to a conductive structure located at the first side of the substrate, wherein the die comprises a second plurality of die pads located at the second side of the die;

a plurality of contact structures, each contact structure of the plurality of contact structures located over and electrically coupled to a die pad of a second plurality of die pads located at the second side of the die; and an encapsulant of encapsulating material, the encapsulant encapsulating the plurality of wires and a portion of each of the plurality of contact structures, wherein a portion of each of the plurality of contact structures is exposed with respect to a first side of the encapsulant, wherein the first side of the encapsulant is located above the second side of the die.

25. The semiconductor package of claim 24 further comprising:

a second substrate having a first side and a second side, wherein the first side is an opposing side to the second side, wherein the first side of the encapsulant faces the first side of the second substrate, wherein each of the plurality of contact structures is electrically coupled to an electrically conductive structure of a plurality of electrically conductive structures of the second substrate.

26. The semiconductor package of claim 25 further comprising:

a plurality of package contacts located at the second side of the second substrate, each of the second plurality of die pads is electrically coupled to a package contact of the plurality of package contacts.

27. The semiconductor package of claim 26 further comprising:

a second plurality of package contacts located at a first side of the semiconductor package, wherein the first side of the semiconductor package is an opposing side to the second side of the second substrate, wherein each die pad of the first plurality of die pads is electrically coupled to a package contact of the second plurality of package contacts.

28. A semiconductor package assembly comprising the semiconductor package of claim 24 and further composing:

a second semiconductor package located over the semiconductor package, the second semiconductor package comprising a plurality of package contacts located on a first side of the second semiconductor package;

wherein the semiconductor package includes a plurality of package contacts located on a first side of the semiconductor package, wherein the first side of the semiconductor package is located above the die; and wherein each of the plurality of package contacts of the semiconductor package is electrically coupled to a package contact of the plurality of package contacts of the second semiconductor package.

* * * * *